United States Patent
Gopinath et al.

(10) Patent No.: US 12,426,278 B2
(45) Date of Patent: Sep. 23, 2025

(54) RESISTIVE MEMORY ELEMENTS ACCESSED BY BIPOLAR JUNCTION TRANSISTORS

(71) Applicant: GlobalFoundries U.S. Inc., Malta, NY (US)

(72) Inventors: Venkatesh P. Gopinath, Fremont, CA (US); Alexander Derrickson, Saratoga Springs, NY (US); Hongru Ren, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 478 days.

(21) Appl. No.: 17/974,028

(22) Filed: Oct. 26, 2022

(65) Prior Publication Data

US 2024/0147736 A1    May 2, 2024

(51) Int. Cl.
| | |
|---|---|
| *H10B 63/00* | (2023.01) |
| *H01L 23/48* | (2006.01) |
| *H10N 70/00* | (2023.01) |
| *H10N 70/20* | (2023.01) |

(52) U.S. Cl.
CPC ............ *H10B 63/32* (2023.02); *H01L 23/481* (2013.01); *H10N 70/011* (2023.02); *H10N 70/253* (2023.02); *H10N 70/841* (2023.02)

(58) Field of Classification Search
CPC ........ H10B 63/32; H10B 63/30; H10B 63/80; H01L 23/481; H10N 70/011; H10N 70/253; H10N 70/841; H10N 70/245; H10N 70/826
See application file for complete search history.

(56) References Cited

U.S. PATENT DOCUMENTS

| | | | |
|---|---|---|---|
| 7,342,293 | B2 | 3/2008 | Wallner et al. |
| 8,674,440 | B2 | 3/2014 | Korec et al. |
| 9,742,147 | B2 | 8/2017 | Cai et al. |
| 9,991,368 | B2 | 6/2018 | Ting et al. |
| 11,133,397 | B2 | 9/2021 | Martin et al. |

(Continued)

OTHER PUBLICATIONS

S. Verdonckt-Vandebroek, S. S. Wong, J. C. S. Woo and P. K. Ko, "High-gain lateral bipolar action in a MOSFET structure," in IEEE Transactions on Electron Devices, vol. 38, No. 11, pp. 2487-2496, Nov. 1991, doi: 10.1109/16.97413.

(Continued)

*Primary Examiner* — Allison Bernstein
(74) *Attorney, Agent, or Firm* — Thompson Hine LLP

(57) ABSTRACT

Structures that include resistive memory elements and methods of forming a structure that includes resistive memory elements. The structure comprises a bipolar junction transistor including a base, a first terminal having a first raised semiconductor layer over the base, and a second terminal having a second raised semiconductor layer over the base. The first raised semiconductor layer is spaced in a lateral direction from the second raised semiconductor layer. The structure further comprises a resistive memory element including a first electrode, a second electrode, and a switching layer between the first electrode and the second electrode. The first electrode of the resistive memory element is coupled to the first terminal of the bipolar junction transistor.

20 Claims, 8 Drawing Sheets

(56) References Cited

U.S. PATENT DOCUMENTS

| | | | | |
|---|---|---|---|---|
| 2012/0214262 A1* | 8/2012 | Yu | ....................... | H10B 69/00 |
| | | | | 257/E21.531 |
| 2013/0256757 A1* | 10/2013 | Cai | ..................... | H10D 10/051 |
| | | | | 257/E29.188 |
| 2015/0348844 A1* | 12/2015 | BrightSky | .......... | H10D 84/0112 |
| | | | | 257/427 |
| 2019/0148454 A1 | 5/2019 | Tran et al. | | |

OTHER PUBLICATIONS

I.-S. M. Sun et al., "Novel ultra-low power RF Lateral BJT on SOI-CMOS compatible substrate," 2005 IEEE Conference on Electron Devices and Solid-State Circuits, 2005, pp. 317-320, doi: 10.1109/EDSSC.2005.1635271.

Meng-Fan Chang et al., "Area-efficient embedded RRAM macros with sub-5ns random-read access-time using logic-process parasitic-BJT-switch (0T1R) Cell and read-disturb-free temperature-aware current-mode read scheme," 2013 Symposium on VLSI Circuits, 2013, pp. C112-C113.

* cited by examiner

RESISTIVE MEMORY ELEMENTS ACCESSED BY BIPOLAR JUNCTION TRANSISTORS

BACKGROUND

This disclosure relates to integrated circuits and semiconductor device fabrication and, more specifically, to structures that include resistive memory elements and methods of forming a structure that includes resistive memory elements.

A resistive random-access memory device provides one type of embedded non-volatile memory technology. A bitcell of a resistive random-access memory device includes a resistive memory element and an access transistor that controls operations used to set and reset the resistive memory element. Because resistive memory elements are non-volatile, bits of data are retained as stored content by the resistive memory elements when the resistive random-access memory device is not powered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

A resistive memory element includes a switching layer that is positioned between a bottom electrode and a top electrode. The resistive memory element can be programmed by changing the resistance across the switching layer to provide different content-storage states, namely a high-resistance state and a low-resistance state, representing the stored bits of data. The switching layer can be modified by applying a programming voltage across the bottom and top electrodes that is sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the resistive memory element to the high-resistance state. The content-storage state can be read by measuring a voltage drop across the resistive memory element after it is programmed.

Improved structures including resistive memory elements and methods of forming a structure that includes resistive memory elements are needed.

SUMMARY

According to an embodiment of the invention, a structure comprises a bipolar junction transistor including a base, a first terminal having a first raised semiconductor layer over the base, and a second terminal having a second raised semiconductor layer over the base. The first raised semiconductor layer is spaced in a lateral direction from the second raised semiconductor layer. The structure further comprises a resistive memory element including a first electrode, a second electrode, and a switching layer between the first electrode and the second electrode. The first electrode of the resistive memory element is coupled to the first terminal of the bipolar junction transistor.

According to an embodiment of the invention, a method comprises forming a bipolar junction transistor including a base, a first terminal having a first raised semiconductor layer over the base, and a second terminal having a second raised semiconductor layer over the base. The first raised semiconductor layer is spaced in a lateral direction from the second raised semiconductor layer. The method further comprises forming a resistive memory element including a first electrode, a second electrode, and a switching layer between the first electrode and the second electrode. The first electrode of the resistive memory element is coupled to the first terminal of the bipolar junction transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
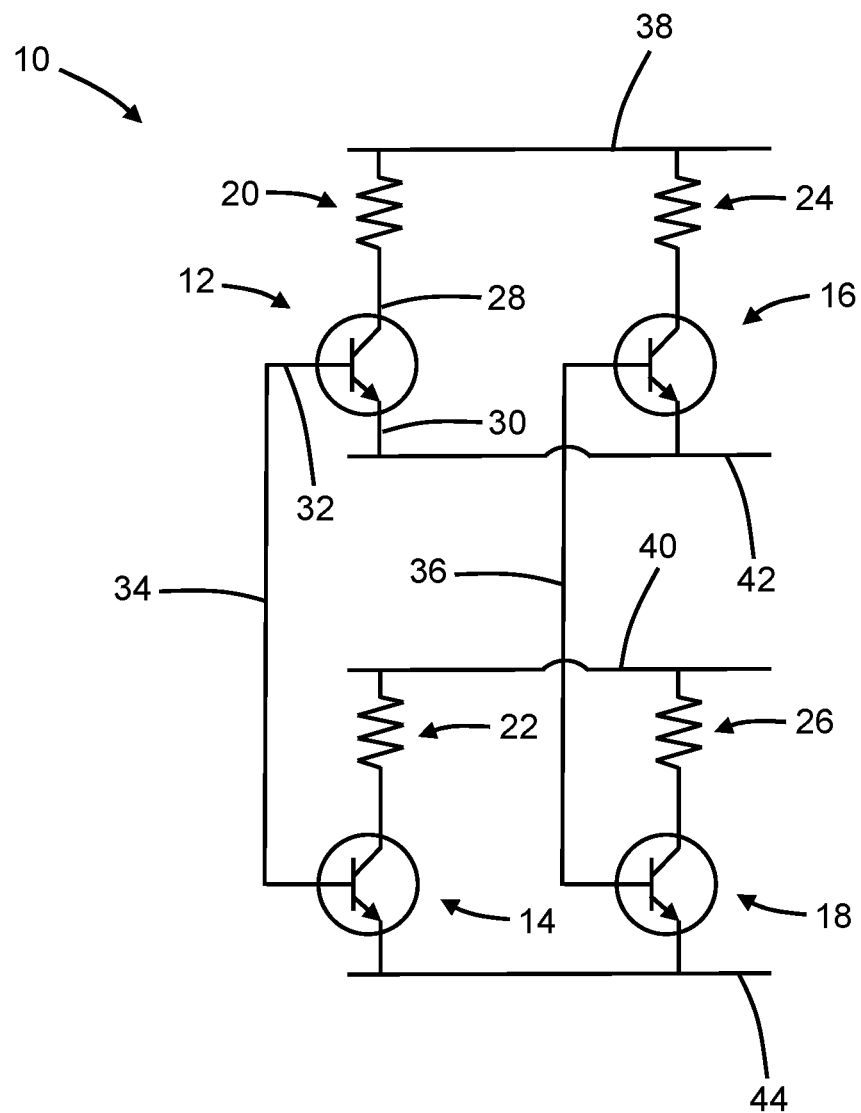
FIG. 1 is a circuit diagram including bipolar junction transistors and resistive memory elements in accordance with embodiments of the invention.
Figure 2:
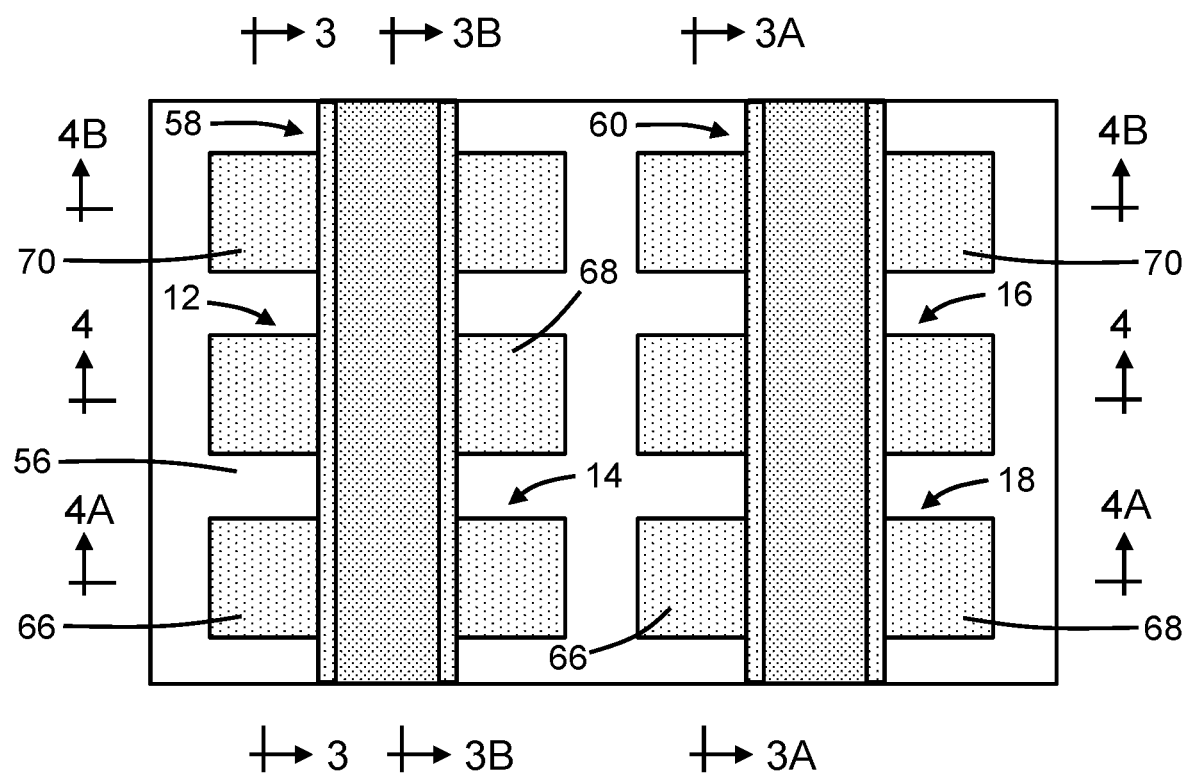
FIG. 2 is a top view of a structure at an initial fabrication stage of a processing method in accordance with embodiments of the invention.
Figure 3:
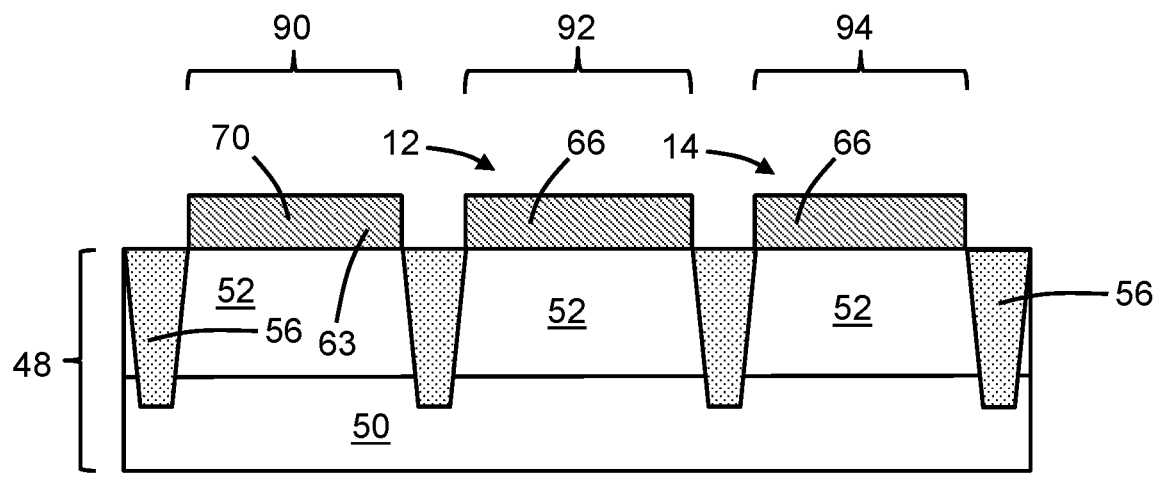
FIG. 3 is a cross-sectional view taken generally along line 3-3 in FIG. 2.
Figure 3A:
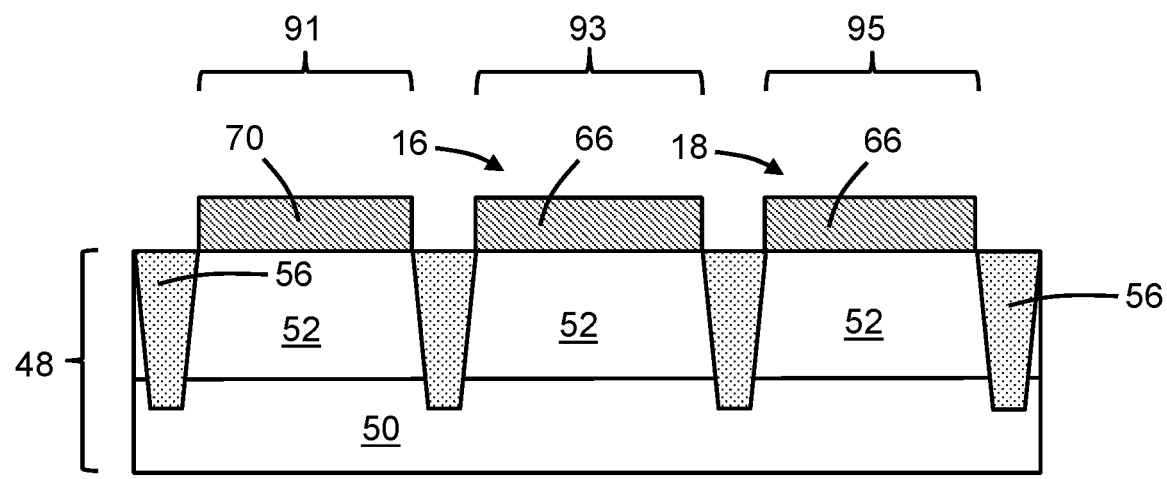
FIG. 3A is a cross-sectional view taken generally along line 3A-3A in FIG. 2.
Figure 3B:
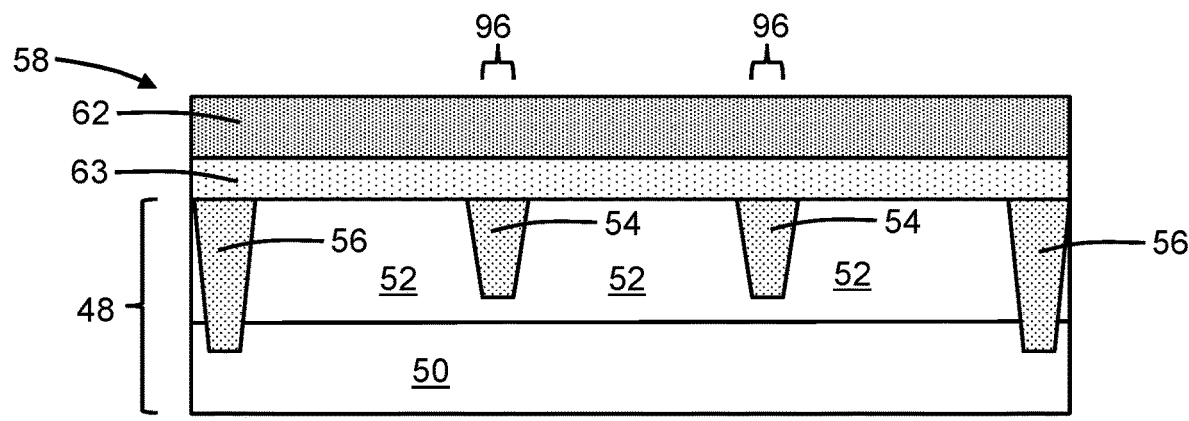
FIG. 3B is a cross-sectional view taken generally along line 3B-3B in FIG. 2.

With reference to FIG. 1 and in accordance with embodiments of the invention, a structure 10 for a resistive random-access memory device includes bipolar junction transistors 12, 14, 16, 18 and resistive memory elements 20, 22, 24, 26 that are respectively coupled to the bipolar junction transistors 12, 14, 16, 18 to define bitcells. The bipolar junction transistors 12, 14, 16, 18 provide access transistors for the bitcells, and the resistive memory elements 20, 22, 24, 26 can be programmed under the control of the bipolar junction transistors 12, 14, 16, 18 to have a high-resistance state and a low-resistance state, and can also be read under the control of the bipolar junction transistors 12, 14, 16, 18.

The bipolar junction transistors 12, 14, 16, 18 may be arranged in an array characterized by rows and columns. Each of the bipolar junction transistors 12, 14, 16, 18 includes a collector 28, an emitter 30, and a base 32. A word line 34 may be physically and electrically connected to the base 32 of the bipolar junction transistor 12 and the base 32 of the bipolar junction transistor 14. A word line 36 may be physically and electrically connected to the base 32 of the bipolar junction transistor 16 and the base 32 of the bipolar junction transistor 18. The word lines 34, 36 may be connected to peripheral circuits that include, for example, word line drivers.

The resistive memory elements 20, 22, 24, 26 may be arranged in an array characterized by rows and columns. The collector 28 of the bipolar junction transistor 12 is physically and electrically connected by a connection in a back-end-of-line structure to the cathode electrode of the resistive memory element 20. The collector 28 of the bipolar junction transistor 14 is physically and electrically connected by an interconnection in the back-end-of-line structure to the cathode electrode of the resistive memory element 22. The collector 28 of the bipolar junction transistor 16 is physically and electrically connected by an interconnection in the back-end-of-line structure to the cathode electrode of the resistive memory element 24. The collector 28 of the bipolar junction transistor 18 is physically and electrically connected by an interconnection in the back-end-of-line structure to the cathode electrode of the resistive memory element 26.

The back-end-of-line structure includes a bit line 38 that may be physically and electrically connected by interconnections in the back-end-of-line structure to the anode electrodes of the resistive memory elements 20, 24. The back-end-of-line structure includes a bit line 40 that is physically and electrically connected by interconnections in the back-end-of-line structure to the anode electrodes of the resistive memory elements 22, 26. The bit lines 38, 40 may be connected to peripheral circuits that include, for example, bit line drivers, a multiplexer, and a sense amplifier. The back-end-of-line structure includes a source line 42 that may be physically and electrically connected by interconnections in the back-end-of-line structure to the emitters 30 of the bipolar junction transistors 12, 16, and the back-end-of-line structure also includes a source line 44 that is physically and electrically connected by interconnections in the back-end-of-line structure to the emitters 30 of the bipolar junction transistors 14, 18.

The bit lines 38, 40 may be longitudinally aligned parallel to the source lines 42, 44. The word lines 34, 36 may be longitudinally aligned in a different direction from the bit lines 38, 40 and the source lines 42, 44. In an embodiment, the word lines 34, 36 may be longitudinally aligned transverse (i.e., perpendicular) to the bit lines 38, 40 and the source lines 42, 44.

With reference to FIGS. 2, 3, 3A, 3B, 4, 4A, 4B and in accordance with embodiments of the invention, the bipolar junction transistors 12, 14, 16, 18 may be formed using a semiconductor substrate 48. The semiconductor substrate 48 may be comprised of a semiconductor material, such as single-crystal silicon. In an embodiment, the semiconductor substrate 48 may comprise a bulk semiconductor substrate. In an alternative embodiment, the semiconductor substrate 48 may comprise a hybrid region of a silicon-on-insulator substrate.

A well 50 may be formed in the semiconductor substrate 48 by introducing a dopant by, for example, ion implantation with given implantation conditions. The implantation conditions (e.g., ion species, dose, kinetic energy) may be selected to tune the electrical and physical characteristics of the well 50. In an embodiment, the well 50 may contain a concentration of an n-type dopant (e.g., arsenic or phosphorus) that provides n-type conductivity. The well 50 may be accessible at the top surface of the semiconductor substrate 48.

A well 52 may be formed in the semiconductor substrate 48 by introducing a dopant by, for example, ion implantation with given implantation conditions. The implantation conditions (e.g., ion species, dose, kinetic energy) may be selected to tune the electrical and physical characteristics of the well 52. In an embodiment, the well 52 may contain a concentration of a p-type dopant (e.g., boron) that provides p-type conductivity. The well 52 is positioned in a vertical direction between the well 50 and the top surface of the semiconductor substrate 48.

Shallow trench isolation regions 54 and deep trench isolation regions 56 are formed that penetrate into the semiconductor substrate 48. The deep trench isolation regions 56 extend to a greater depth in the semiconductor substrate 48 than the shallow trench isolation regions 54. In particular, the deep trench isolation regions 56 may penetrate fully through the well 52 and the shallow trench isolation regions 54 may only penetrate partially through the well 52. The shallow trench isolation regions 54 interrupt the continuity of the deep trench isolation regions 56. The shallow trench isolation regions 54 and deep trench isolation regions 56 divide the well 52 into sections 90, 92, 94 and sections 91, 93, 95, which enables electrical isolation of the different bitcells along with the well 50. Each of the sections 90, 92, 94 is partially surrounded by the deep trench isolation regions 56, and each of the sections 90, 92, 94 is fully surrounded by a combination of the shallow trench isolation regions 54 and deep trench isolation regions 56. The different sections 90, 92, 94 of the well 52 are connected by a pathway in the well 52 (i.e., word line 34) that extends beneath the shallow trench isolation regions 54. Each of the sections 91, 93, 95 is partially surrounded by the deep trench isolation regions 56, and each of the sections 91, 93, 95 is fully surrounded by a combination of the shallow trench isolation regions 54 and deep trench isolation regions 56. The different sections 91, 93, 95 of the well 52 are connected by a pathway in the well 52 (i.e., word line 36) that extends beneath the shallow trench isolation regions 54.

The shallow trench isolation regions 54 may be formed by patterning shallow trenches with lithography and etching processes, depositing a dielectric material to fill the shallow trenches, and planarizing and/or recessing the dielectric material. The deep trench isolation regions 56 may be formed by patterning deep trenches with lithography and etching processes, depositing a dielectric material to fill the deep trenches, and planarizing and/or recessing the dielectric material. In an embodiment, the shallow trench isolation regions 54 and deep trench isolation regions 56 may contain a dielectric material, such as silicon dioxide, from a layer that is deposited and planarized by chemical-mechanical polishing.

Placement structures 58, 60 may be formed on the top surface of the semiconductor substrate 48. In an embodiment, each of the placement structures 58, 60 may include a gate 62, a gate dielectric 63 between the gate 62 and the semiconductor substrate 48, and sidewall spacers 64 characteristic of a gate structure for a planar field-effect transistor. The gate 62 may be comprised of a conductor, such as doped polysilicon, the gate dielectric 63 may be comprised of a dielectric material, such as silicon dioxide, that is an electrical insulator, and the sidewall spacers 64 may be comprised of a dielectric material, such as silicon nitride, that is an electrical insulator. In an embodiment, the placement structures 58, 60 may be formed at minimum pitch for the technology node.

Raised semiconductor layers 66, 68 are formed adjacent to the opposite sides of the placement structures 58, 60 and on the different sections 92, 93, 94, 95 of the well 52. On each of the sections 92, 93, 94, 95, the raised semiconductor layer 66 is spaced in a lateral direction from the raised semiconductor layer 68. The raised semiconductor layers 66, 68 may provide terminals (i.e., the collector 28 and the emitter 30) of the bipolar junction transistors 12, 14, 16, 18. Raised semiconductor layers 70 are formed adjacent to the opposite sides of the placement structures 58, 60 and on the different sections 90, 91 of the well 52. On each of the sections 90, 91, the raised semiconductor layers 70 are spaced in a lateral direction from each other.

The raised semiconductor layers 66, 68 and raised semiconductor layers 70 may be comprised of a semiconductor material, such as single-crystal silicon. The raised semiconductor layers 66, 68 have an opposite conductivity type from the well 52 and the raised semiconductor layers 70. The raised semiconductor layers 70 may have the same conductivity type as the well 52. In an embodiment, the raised semiconductor layers 66, 68 may be doped (e.g., heavily doped) with a concentration of a dopant, such as an n-type dopant (e.g., phosphorus or arsenic) to provide n-type conductivity, and the raised semiconductor layers 70 may be doped (e.g., heavily doped) with a concentration of a dopant, such as a p-type dopant (e.g., boron) to provide p-type conductivity. The raised semiconductor layers 66, 68 and the raised semiconductor layers 70 may be formed by separate epitaxial growth processes with the placement structures 58, 60 providing self-alignment of the epitaxially-grown semiconductor material to the sections 90-95 of the well 52.

The sections 90, 92, 94 of the well 52 and the sections 91, 93, 95 of the well 52 are arranged in separate columns of a two-dimensional array. The deep trench isolation regions 56 and well 50 electrically isolate the sections 90, 92, 94 of the well 52 in one column from the sections 91, 93, 95 of the well 52 in the adjacent column. The sections 92, 94 of the well 52 respectively provide distinct bases for the bipolar junction transistors 12, 14. The section 90 of the well 52 and the raised semiconductor layers 70 on the section 90 provide a base pick-up for the sections 92, 94 of the well 52. The sections 93, 95 of the well 52 respectively provide distinct bases for the bipolar junction transistors 16, 18. The section 91 of the well 52 and the raised semiconductor layers 70 on the section 91 provide a base pick-up for the sections 93, 95 of the well 52.

The placement structure 58 extends in a lateral direction across the sections 90, 92, 94 of the well 52. The placement structure 58 is positioned to overlap with strips of the sections 90, 92, 94 of the well 52, the shallow trench isolation regions 54 between these strips of the sections 90, 92, 94 of the well 52, and bridge sections 96 of the well 52 located beneath the shallow trench isolation regions 54. The bridge sections 96 of the well 52, which are arranged in a vertical direction between the shallow trench isolation regions 54 and the well 50, extend beneath the shallow trench isolation regions 54 to connect the section 90 to the sections 92, 94. The bridge sections 96 of the well 52 contribute to defining a word line for the bipolar junction transistors 12, 14.

The placement structure 60 extends in a lateral direction across the sections 91, 93, 95 of the well 52. The placement structure 60 is positioned to overlap with strips of the sections 91, 93, 95 of the well 52, the shallow trench isolation regions 54 between these strips of the sections 91, 93, 95 of the well 52, and bridge sections 96 of the well 52 located beneath the shallow trench isolation regions 54. The bridge sections 96 of the well 52, which are arranged in a vertical direction between the shallow trench isolation regions 54 and the well 50, extend beneath the shallow trench isolation regions 54 to connect the section 91 to the sections 93, 95. The bridge sections 96 of the well 52 contribute to defining a word line for the bipolar junction transistors 16, 18.

Figure 4:
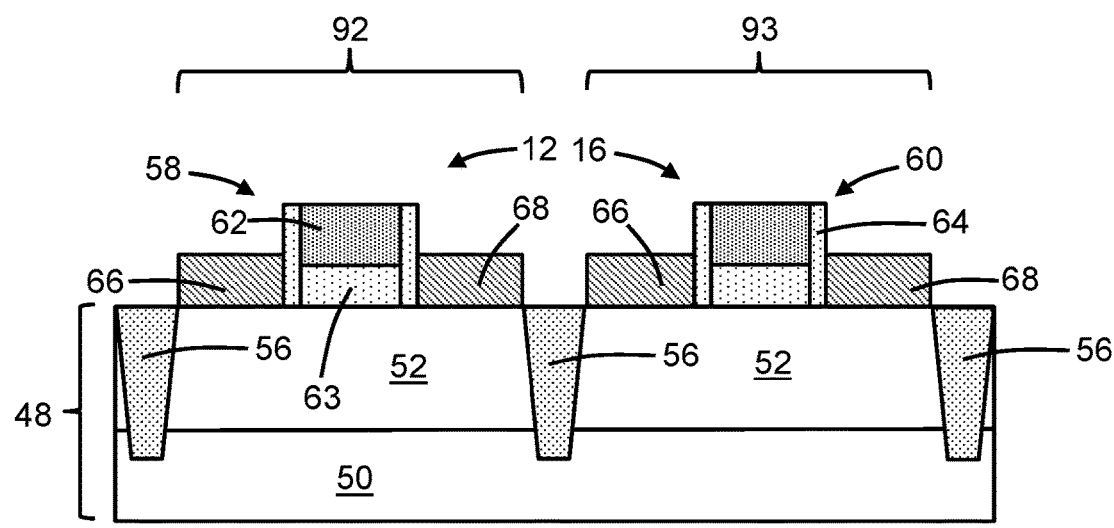
FIG. 4 is a cross-sectional view taken generally along line 4-4 in FIG. 2.
Figure 4A:
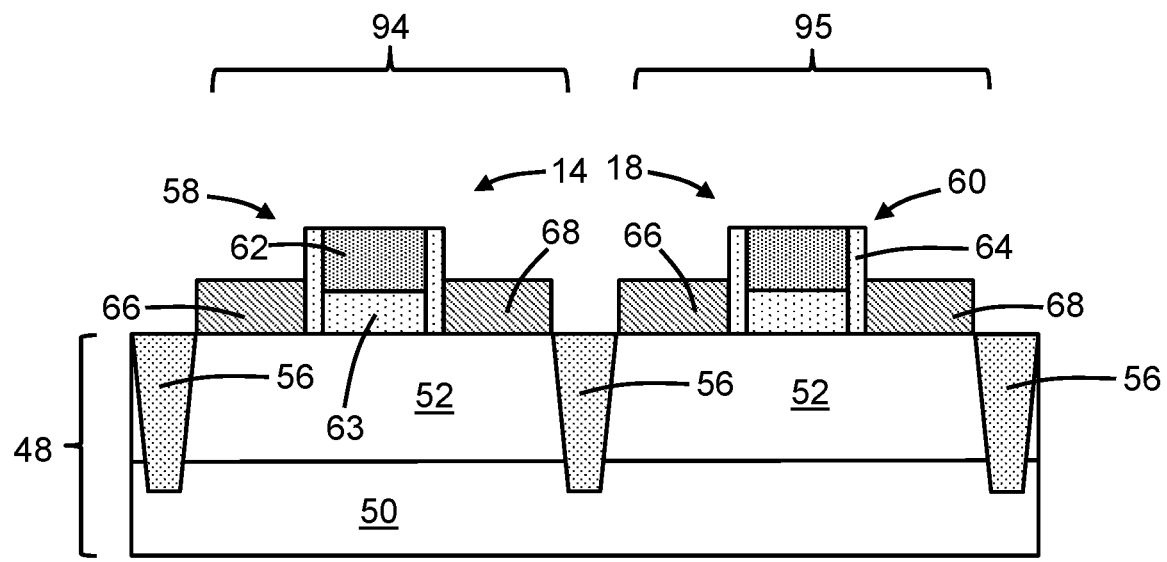
FIG. 4A is a cross-sectional view taken generally along line 4A-4A in FIG. 2.
Figure 4B:
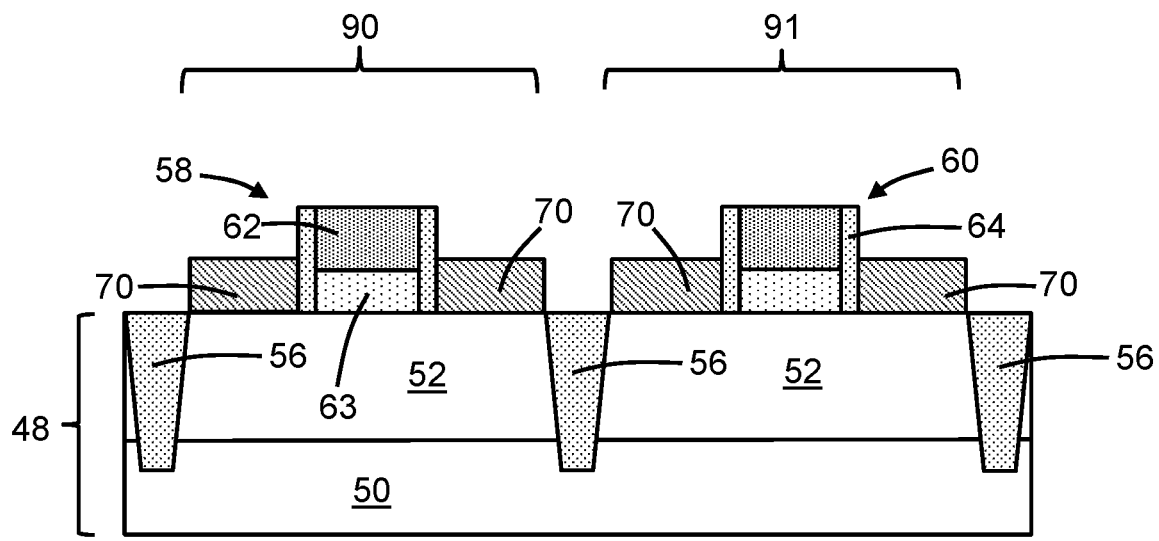
FIG. 4B is a cross-sectional view taken generally along line 4B-4B in FIG. 2.
Figure 5:
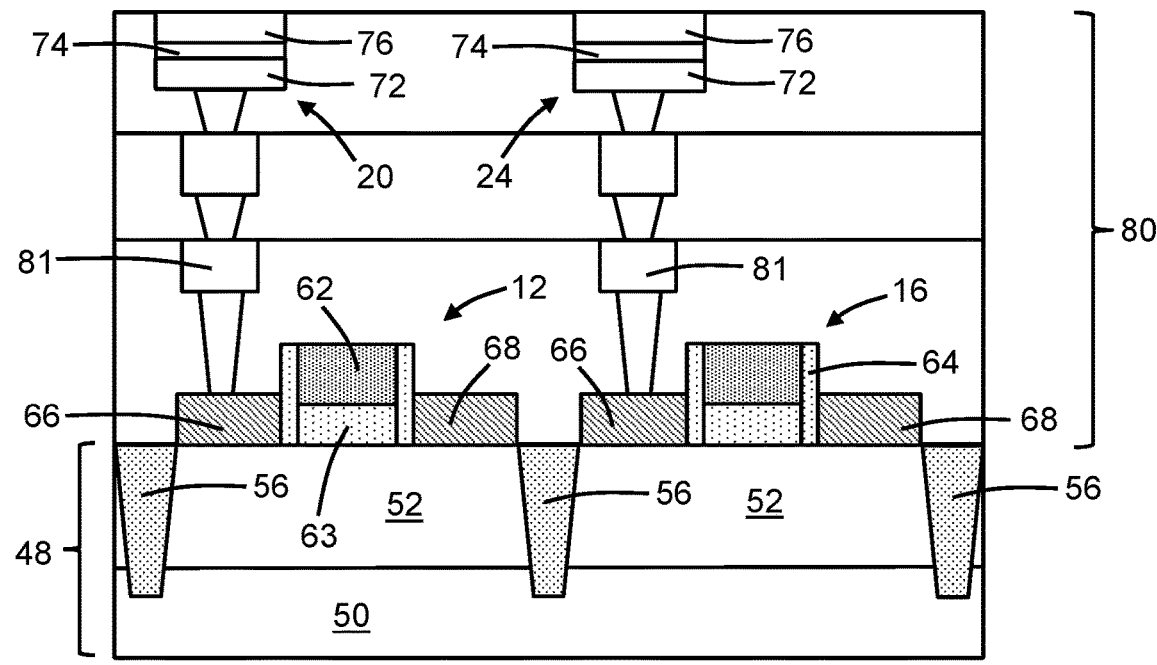
FIGS. 5, 5A are cross-sectional views of the structure at a fabrication stage subsequent to FIGS. 2, 3A, 3B, 4, 4A, 4B.
Figure 5A:
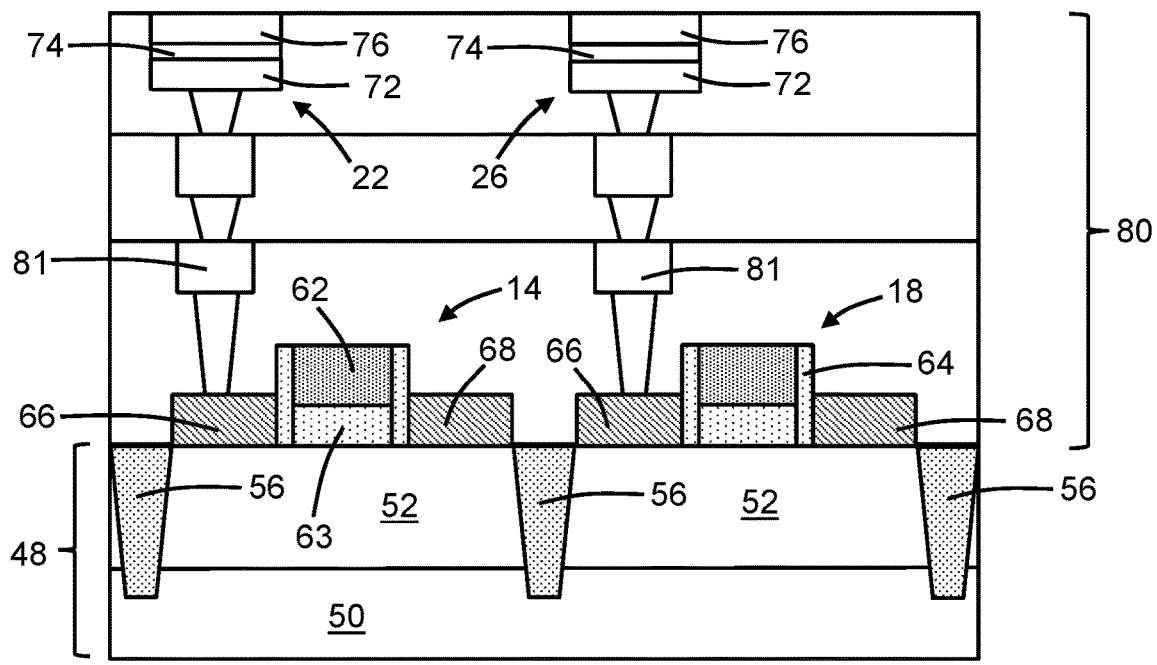

With reference to FIGS. 5, 5A in which like reference numerals refer to like features in FIGS. 4, 4A and at a subsequent fabrication stage, the resistive memory elements 20, 22, 24, 26 are positioned in a back-end-of-line stack 80 that is formed over the bipolar junction transistors 12, 14, 16, 18 and the semiconductor substrate 48. Each of the resistive memory elements 20, 22, 24, 26 includes a bottom electrode 72 that is coupled by a vertical interconnection 81 in the back-end-of-line stack 80 to the raised semiconductor layers 66 of one of the bipolar junction transistors 12, 14, 16, 18, a switching layer 74, and a top electrode 76. The bottom electrode 72 may be contacts comprised of a metal, such as tantalum, titanium nitride, or tantalum nitride. Each bottom electrode 72 may define a cathode of one of the resistive memory elements 20, 22, 24, 26. The switching layer 74 may be comprised of a dielectric material, such as hafnium oxide, magnesium oxide, tantalum oxide, titanium oxide, aluminum oxide, silicon nitride, or silicon dioxide. The top electrode 76 may be comprised of a metal, such as tungsten, titanium nitride, tantalum nitride, or platinum. In an alternative embodiment, the bottom electrode 72 of each of the resistive memory elements 20, 22, 24, 26 may be coupled by one of the vertical interconnections 81 in the back-end-of-line stack 80 to the raised semiconductor layer 68, instead of the raised semiconductor layer 66, of one of the bipolar junction transistors 12, 14, 16, 18.

The back-end-of-line stack 80 may be fabricated by back-end-of-line processing over the semiconductor substrate 48. The back-end-of-line stack 80 includes interlayer dielectric layers, vertical interconnections 81 having metal islands, vias, and/or contacts arranged in the interlayer dielectric layers, and metal features arranged as interconnects in the interlayer dielectric layers. The bit lines 38, 40 and the source lines 42, 44 (FIG. 1) are provided by metal features located in the back-end-of-line stack 80, whereas the word lines 34, 36 are provided by portions of the well 52 in the semiconductor substrate 48. The bit lines 38, 40 and the source lines 42, 44 are coupled to the resistive memory elements 20, 22, 24, 26 and the bipolar junction transistors 12, 14, 16, 18 by the vertical interconnections 81. The one or more interlayer dielectric layers may be comprised of a dielectric material, such as silicon dioxide, and the interconnections and metal features may be comprised of one or more metals, such as copper, aluminum, tungsten, and/or a metal silicide.

In an embodiment, the placement structures 58, 60 may be dummy structures that lack any connection to metal features in the back-end-of-line stack 80. In an alternative embodiment, the placement structures 58, 60 may connected to ground by metal features in the back-end-of-line stack 80. In an alternative embodiment, the placement structures 58, 60 may connected to a bias potential by metal features in the back-end-of-line stack 80. In an alternative embodiment, the placement structures 58, 60 may provide field-effect transistors connected in parallel with the bipolar junction transistors 12, 14, 16, 18 and may provide an extra current boost for a selected bitcell.

The bipolar junction transistors 12, 14, 16, 18 provide highly-scalable access transistors for the resistive memory elements 20, 22, 24, 26 that may be deployed in a resistive random-access memory device to improve bitcell scalability. The bipolar junction transistors 12, 14, 16, 18 provide significantly smaller access transistors for the resistive memory elements 20, 22, 24, 26 than conventional field-effect transistors and are characterized by higher drive currents than conventional field-effect transistors.

Figure 6:
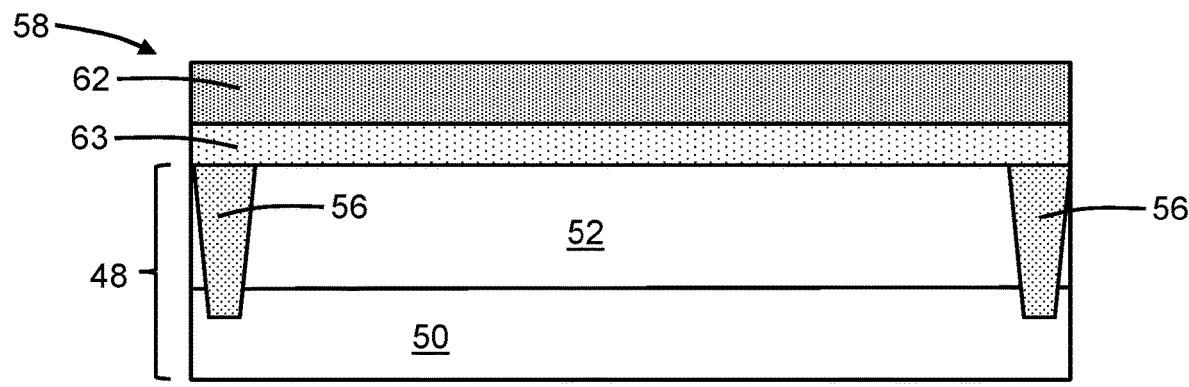
FIG. 6 is a cross-sectional view of a structure in accordance with alternative embodiments of the invention.

With reference to FIG. 6 and in accordance with alternative embodiments, the shallow trench isolation regions 54 may be eliminated beneath the placement structures 58, 60 to form gaps in the deep trench isolation regions 56. The gaps in the deep trench isolation regions 56 beneath the placement structure 58, which are formed by the elimination of the shallow trench isolation regions 54, connect the sections 90, 92, 94 of the well 52. Similarly, the gaps in the deep trench isolation regions 56 beneath the placement structure 60, which are formed by the elimination of the shallow trench isolation regions 54, connect the sections 91, 93, 95 of the well 52. The gaps in the deep trench isolation regions 56 may have the full height or thickness of the well 52.

Figure 7:
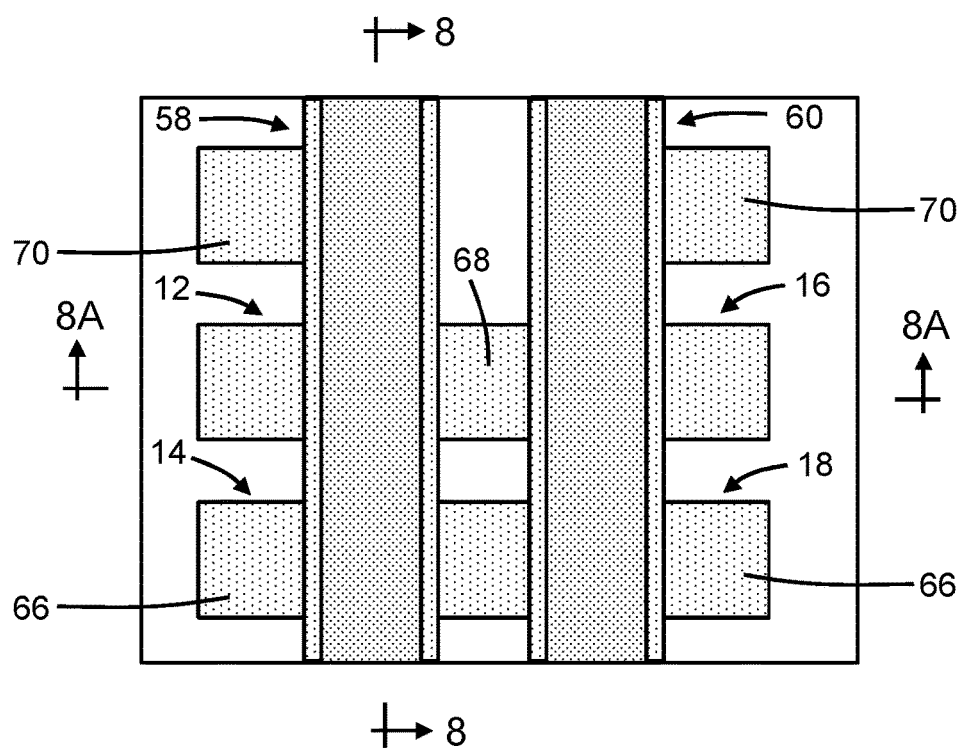
FIG. 7 is a top view of a structure in accordance with alternative embodiments of the invention.
Figure 8:
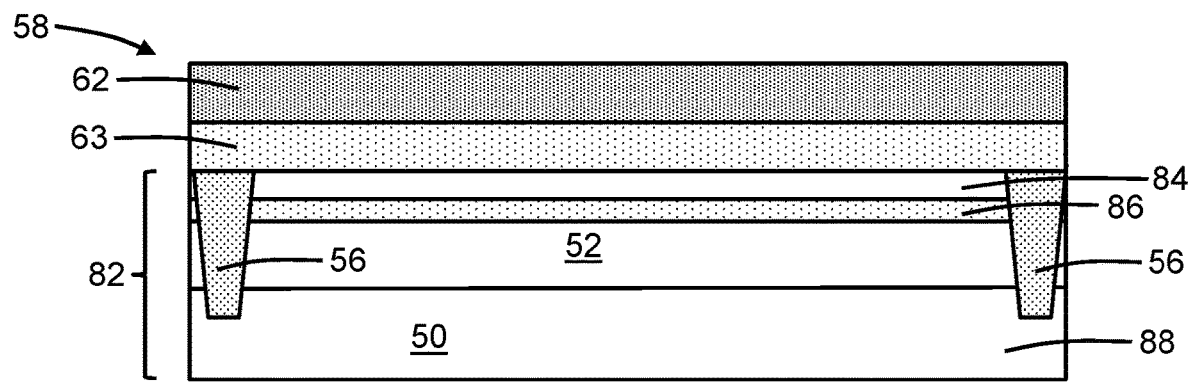
FIG. 8 is a cross-sectional view taken generally along line 8-8 in FIG. 7.
Figure 8A:
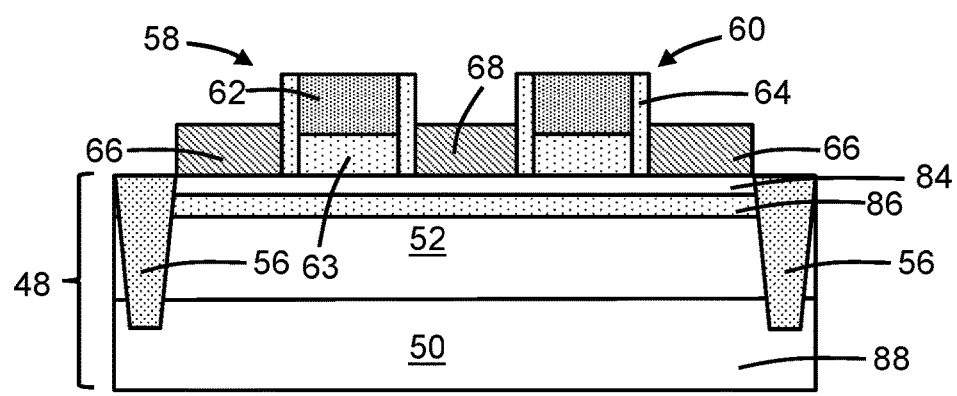
FIG. 8A is a cross-sectional view taken generally along line 8A-8A in FIG. 7.

With reference to FIGS. 7, 8, 8A and in accordance with alternative embodiments, the bipolar junction transistors 12, 14, 16, 18 may be fabricated using a silicon-on-insulator substrate 82 that includes a semiconductor layer 84, a dielectric layer 86, and a semiconductor substrate 88. The semiconductor layer 84 is separated from the semiconductor substrate 88 by the intervening dielectric layer 86. The semiconductor layer 84 may be comprised of a semiconductor material, such as single-crystal silicon, and may be intrinsic or lightly doped p-type. The dielectric layer 86 may be comprised of a dielectric material, such as silicon dioxide, that is an electrical insulator. The semiconductor substrate 88 may be comprised of a semiconductor material, such as silicon, and may be lightly doped p-type. The dielectric layer 86 has an upper interface with the semiconductor layer 84 and a lower interface with the semiconductor substrate 88.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a first well in the semiconductor substrate;
   a plurality of deep trench isolation regions penetrating fully through the first well, the plurality of deep trench isolation regions partially surrounding a first section of the first well;
   a first bipolar junction transistor including a base, a first terminal having a first raised semiconductor layer over the base, and a second terminal having a second raised semiconductor layer over the base, the first raised semiconductor layer spaced in a lateral direction from the second raised semiconductor layer; and
   a first resistive memory element including a first electrode, a second electrode, and a switching layer between the first electrode and the second electrode, the first electrode coupled to the first terminal of the first bipolar junction transistor,
   wherein the base of the first bipolar junction transistor comprises the first section of the first well.

2. The structure of claim 1 wherein the first terminal is a collector of the first bipolar junction transistor, and the second terminal is an emitter of the first bipolar junction transistor.

3. The structure of claim 1 wherein the first raised semiconductor layer of the first terminal is coupled to the first electrode of the first resistive memory element.

4. The structure of claim 1 further comprising:
   a second well in the semiconductor substrate,
   wherein the first section of the first well is positioned in a vertical direction between the second well and the first terminal, and the first section of the first well is positioned in the vertical direction between the second well and the second terminal.

5. The structure of claim 4 wherein the deep trench isolation regions penetrate into the second well.

6. The structure of claim 4 wherein the first well has a first conductivity type, and the second well has a second conductivity type opposite from the first conductivity type.

7. The structure of claim 1 wherein the plurality of deep trench isolation regions partially surround a second section of the first well, and further comprising:
a second bipolar junction transistor including a base, a first terminal having a first raised semiconductor layer over the base, and a second terminal having a second raised semiconductor layer over the base, the first raised semiconductor layer spaced in the lateral direction from the second raised semiconductor layer,
wherein the base of the second bipolar junction transistor comprises the second section of the first well.

8. The structure of claim 7 further comprising:
a second resistive memory element including a first electrode, a second electrode, and a switching layer between the first electrode and the second electrode,
wherein the second terminal of the second bipolar junction transistor is coupled to the first electrode of the second resistive memory element.

9. The structure of claim 7 further comprising:
a shallow trench isolation region positioned between the first section of the first well and the second section of the first well, the shallow trench isolation region penetrating partially through the first well.

10. The structure of claim 9 wherein the deep trench isolation regions and the shallow trench isolation region fully surround the first section of the first well.

11. The structure of claim 10 wherein the first well includes a third section positioned beneath the shallow trench isolation region, and the third section connects the first section of the first well with the second section of the first well.

12. The structure of claim 7 further comprising:
a placement structure extending across the first section of the first well and the second section of the first well, the placement structure positioned in the lateral direction between the first raised semiconductor layer and the second raised semiconductor layer of the first bipolar junction transistor.

13. The structure of claim 12 further comprising:
a shallow trench isolation region positioned between the first section of the first well and the second section of the first well, the shallow trench isolation region penetrating partially through the first well,
wherein the placement structure is positioned to overlap with the shallow trench isolation region.

14. The structure of claim 12 wherein the placement structure comprises a gate and a gate dielectric layer between the gate and the semiconductor substrate.

15. The structure of claim 1 further comprising:
a back-end-of-line stack on the semiconductor substrate, the back-end-of-line stack comprising one or more interlayer dielectric layers,
wherein the first resistive memory element is positioned in the back-end-of-line stack.

16. The structure of claim 15 wherein the back-end-of-line stack comprises a vertical interconnection in the one or more interlayer dielectric layers, and the vertical interconnection couples the first terminal of the first bipolar junction transistor to the first electrode of the first resistive memory element.

17. The structure of claim 1 further comprising:
a dielectric layer positioned between the first bipolar junction transistor and the semiconductor substrate.

18. A structure comprising: a semiconductor substrate; a plurality of shallow trench isolation regions in the semiconductor substrate; a plurality of deep trench isolation regions in the semiconductor substrate, the deep trench isolation regions penetrating to a greater depth in the semiconductor substrate than the shallow trench isolation regions; a bipolar junction transistor including a base, a first terminal having a first raised semiconductor layer over the base, and a second terminal having a second raised semiconductor layer over the base, the first raised semiconductor layer spaced in a lateral direction from the second raised semiconductor layer; and a resistive memory element including a first electrode, a second electrode, and a switching layer between the first electrode and the second electrode, the first electrode coupled to the first terminal of the bipolar junction transistor, wherein the plurality of deep trench isolation regions and the plurality of shallow trench isolation regions fully surround the base of the bipolar junction transistor.

19. The structure of claim 18 further comprising:
a well in the semiconductor substrate,
wherein the base of the bipolar junction transistor comprises a section of the well.

20. A method comprising:
forming a well in a semiconductor substrate;
forming a plurality of deep trench isolation regions penetrating fully through the well, wherein the plurality of deep trench isolation regions partially surround a section of the well;
forming a bipolar junction transistor including a base, a first terminal having a first raised semiconductor layer over the base, and a second terminal having a second raised semiconductor layer over the base, wherein the first raised semiconductor layer is spaced in a lateral direction from the second raised semiconductor layer; and
forming a resistive memory element including a first electrode, a second electrode, and a switching layer between the first electrode and the second electrode, wherein the first electrode is coupled to the first terminal of the bipolar junction transistor,
wherein the base of the bipolar junction transistor comprises the section of the well.

\* \* \* \* \*